US009373388B1

(12) United States Patent
Ahmed et al.

(10) Patent No.: US 9,373,388 B1
(45) Date of Patent: Jun. 21, 2016

(54) SENSE AMPLIFIER WITH PULSED CONTROL FOR PULL-UP TRANSISTORS

(71) Applicant: QUALCOMM Incorporated, San Diego, CA (US)

(72) Inventors: Fahad Ahmed, San Diego, CA (US); Chulmin Jung, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/699,957

(22) Filed: Apr. 29, 2015

(51) Int. Cl.
   *G11C 11/00*   (2006.01)
   *G11C 11/419*  (2006.01)
   *G11C 7/12*    (2006.01)
   *G11C 7/06*    (2006.01)

(52) U.S. Cl.
   CPC .............. *G11C 11/419* (2013.01); *G11C 7/062* (2013.01); *G11C 7/065* (2013.01); *G11C 7/12* (2013.01)

(58) Field of Classification Search
   CPC .......... G11C 7/065; G11C 7/12; G11C 7/062; G11C 11/419
   USPC ...................... 365/203, 205, 207, 51, 63, 156
   See application file for complete search history.

(56) References Cited

U.S. PATENT DOCUMENTS

| 6,108,258 | A   |   | 8/2000  | Chen et al. |           |
|-----------|-----|---|---------|-------------|-----------|
| 6,480,037 | B1  | * | 11/2002 | Song ...................... | G11C 7/065 327/55 |
| 6,822,918 | B2  | * | 11/2004 | Slamowitz ............... | G11C 7/02 365/189.07 |
| 7,408,827 | B1  |   | 8/2008  | Peng et al. |           |
| 7,616,513 | B1  |   | 11/2009 | Peng et al. |           |
| 2012/0235708 | A1 | * | 9/2012 | Slamowitz ........... | G11C 11/419 327/53 |
| 2013/0258794 | A1 |   | 10/2013 | Sharad et al. |           |

* cited by examiner

*Primary Examiner* — Gene Auduong
(74) *Attorney, Agent, or Firm* — Haynes and Boone, LLP

(57) ABSTRACT

A sense amplifier is provided with a pair of first pull-up transistors that are configured to charge a corresponding pair of output terminals while a delayed sense enable signal is not asserted and to stop charging the corresponding pair of output terminals while the delayed sense enable signal is asserted.

19 Claims, 3 Drawing Sheets

SENSE AMPLIFIER WITH PULSED CONTROL FOR PULL-UP TRANSISTORS

TECHNICAL FIELD

This application relates to improving differential sense amplifiers, and more particularly to pulsed control of differential sense amplifiers to prevent glitches.

BACKGROUND

Sense amplifiers are used for sensing the bit decision from SRAM cells and related differential cell topologies. An example sense amplifier 100 shown in FIG. 1 includes a differential pair of NMOS transistors M1 and M2 but it will be appreciated that the operation of a sense amplifier using a PMOS differential pair is analogous. An SRAM cell (not illustrated) drives a bit line B and a complement bit line B̄ in response to an assertion of the corresponding word line (not illustrated). The bit line B drives the gate of differential pair transistor M1. Similarly, the complement bit line B̄ drives the gate of differential pair transistor M2. The sources of differential pair transistors M1 and M2 couple to ground through a current source NMOS transistor M3 that has its gate driven by the sense enable signal SE. When the sense enable signal SE is asserted to a power supply voltage VDD, current source transistor M3 conducts a current that is steered between the differential pair transistors M1 and M2 depending on the voltage difference that develops across the bit lines. As the current is steered through the differential pair, the drain for the differential pair transistor conducting the greater portion of the steered current will drop in voltage compared to the drain voltage for the remaining differential pair transistor. This voltage difference at the drains of differential pair transistors M1 and M2 is reinforced through a pair of cross-coupled PMOS transistors P1 and P2 to amplify the desired voltage difference that will be expressed as the differential output of sense amplifier 100.

In general, it is desirable for the sense enable signal to be asserted relatively quickly after the assertion of the word line voltage so as to increase the operating speed of the corresponding SRAM. But the architecture for a conventional sense amplifier such as sense amplifier 100 causes timing issues if the sense enable signal is asserted too quickly after the assertion of the word line voltage. To better appreciate this timing issue, note that prior to the assertion of the word line voltage, both bit lines are pre-charged to the power supply voltage VDD. If the sense enable signal is asserted relatively soon after the word line assertion, both differential pair transistors M1 and M2 will thus switch on, which is undesirable since both of their drains will then be discharged. This simultaneous decrease in the drain voltage may cause an error (a glitch) in the differential output voltage of sense amplifier 100. To prevent this glitch, it is conventional to include an always-on keeper PMOS transistor P3 that functions to charge the drain of differential pair transistor M1. Similarly, another always-on keeper PMOS transistor P4 functions to charge the drain of differential pair transistor M2. The keeper transistors P3 and P4 oppose the simultaneous discharge of the drains for differential pair transistors M1 and M2 and thus reduce the possibility of an output glitch.

In general, keeper transistors P3 and P4 must be sized so as to have sufficient strength to prevent the glitch. But note that the resulting strength for keeper transistors P3 and P4 then requires a relatively long delay between the word line voltage assertion and the subsequent sense enable signal assertion so that a sufficient bit line differential voltage is developed to enable differential pair transistors M1 and M2 to overcome the opposition from the keeper transistors P3 and P4 to then develop the necessary differential voltage between their drains. High speed operation is thus hindered in a conventional sense amplifier such as sense amplifier 100.

Accordingly, there is a need in the art for sense amplifiers configured for increased memory operating speeds.

SUMMARY

A sense amplifier is provided that includes a differential pair of transistors configured to steer a current responsive to a voltage difference between a pair of bit lines. Each differential pair transistor includes a terminal that the differential pair transistor is configured discharge responsive to the current steering. The sense amplifier further includes a delay circuit configured to delay a sense enable signal to provide a delayed sense enable signal and also includes a pair of first pull-up transistors corresponding to the pair of differential pair of transistors, each first pull-up transistor being coupled between the terminal of the corresponding differential pair transistor and a power supply node, wherein each first pull-up transistor is configured to switch off responsive to an assertion of the delayed sense enable signal.

Since the pair of first pull-up transistors are turned off responsive to the delayed sense enable signal assertion, they remain on during a delay period between the assertion of the sense enable signal and the assertion of the delayed sense enable signal. In this fashion, the first pull-up transistors can be sized so as to be relatively strong to prevent output glitches that could otherwise occur at the onset of the sense enable signal assertion. In a conventional sense amplifier, such relatively strong pull-up transistors would then require a relatively long delay between word line assertion and the subsequent assertion of the sense enable signal assertion so that the differential bit line voltage could be sufficiently developed to allow the differential pair of transistors to overcome the pull-up to develop a differential output voltage across their terminals. Advantageously, the sense enable signal assertion for the sense amplifier disclosed herein need not be so relatively delayed with regard to the preceding word line assertion because the first pull-up transistors are switched off upon the assertion of the delayed sense enable signal. In this fashion, the timing problems discussed above with regard to conventional sense amplifiers are solved.

These and additional advantageous features may be better appreciated with regard to the following detailed description of example embodiments.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
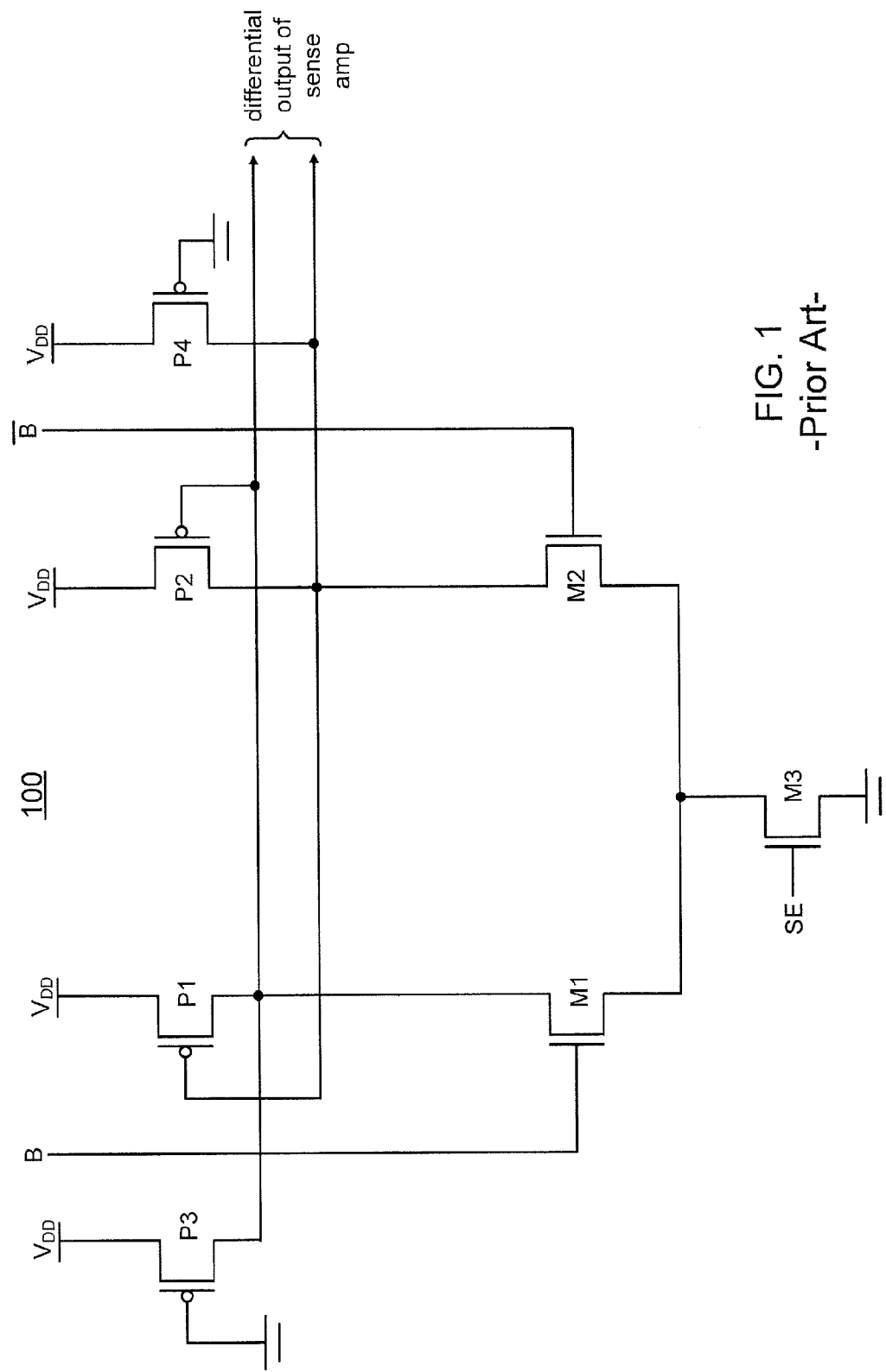
FIG. 1 is a circuit diagram of a conventional sense amplifier.

A sense amplifier is disclosed in which the timing delay between the word line voltage assertion and the sense enable signal assertion can be reduced without the associated output glitches that would occur in conventional sense amplifiers. To provide this salutary effect, the sense amplifier includes a pair of first pull-up transistors corresponding to a differential pair of transistors. Each first pull-up transistor is configured to charge an output terminal for the corresponding differential pair transistor while a delayed sense enable signal is not asserted. Conversely, each first pull-up transistor is further configured to switch off responsive to an assertion of the delayed sense enable signal. In that regard, a sense enable signal assertion period over which a sense enable signal is asserted for a given read operation may be divided into an initial portion in which the first pull-up transistors are conducting and a remaining final portion in which the first pull-up transistors are not conducting. Since the first pull-up transistors are not conducting over the final portion of the sense enable signal assertion period, the first pull-up transistors may be sized so as to be relatively strong. As discussed previously, such relative strength is desirable at the onset of the sense enable signal assertion because the differential bit line voltage will have only been partially developed at that time. Due to the pre-charge of the bit lines to a power supply voltage VDD, such partial development of the differential bit line voltage leaves both bit line voltages relatively close to the power supply voltage level such that a differential pair of transistors in the sense amplifier may be simultaneously switched on. But the relative strength of the first pull-up transistors prevents the conventional problem of glitches arising from the lack of development of the differential bit line voltage.

Conversely, the conventional problem of having to delay the sense enable signal assertion with regard to the preceding word line voltage assertion is solved since the first pull-up transistors shutoff in response to the assertion of the delayed sense enable signal. The differential pair of transistors in the sense amplifier can thus develop an appropriate differential output voltage between their output terminals relatively quickly with regard to the preceding assertion of the word line voltage. The delay between the word line and sense enable signal assertions may thus be reduced as compared to conventional sense amplifier designs. Note that the delayed sense enable signal does not affect the sense amplifier timing as the sense amplifier is still triggered by the sense enable signal, not the delayed sense amplifier signal. The delay sense amplifier signal is merely used to shutoff the first pull-up transistors as discussed further herein.

To further suppress the likelihood of glitches, the sense amplifier may include a pair of second pull-up transistors corresponding to the differential pair of transistors. Analogous to the pair of first pull-up transistors, each second pull-up transistor is also configured to charge the output terminal for the corresponding differential pair transistor. However, in contrast to the first pull-up transistors, the second pull-up transistors may be configured to be always on. Since they are always on, the second pull-up transistor may be sized so as to be relatively weak in comparison to the first pull-up transistors. In this fashion, the relatively weak second pull-up transistors allow the differential pair of transistors to develop a differential output voltage between their output terminals in response to a relatively undeveloped differential bit line voltage. The sense enable signal assertion may thus occur relatively quickly after the word line assertion, which enhances memory operating speed. The following detailed description of an example embodiment may better illustrate these advantageous features.

Figure 2:
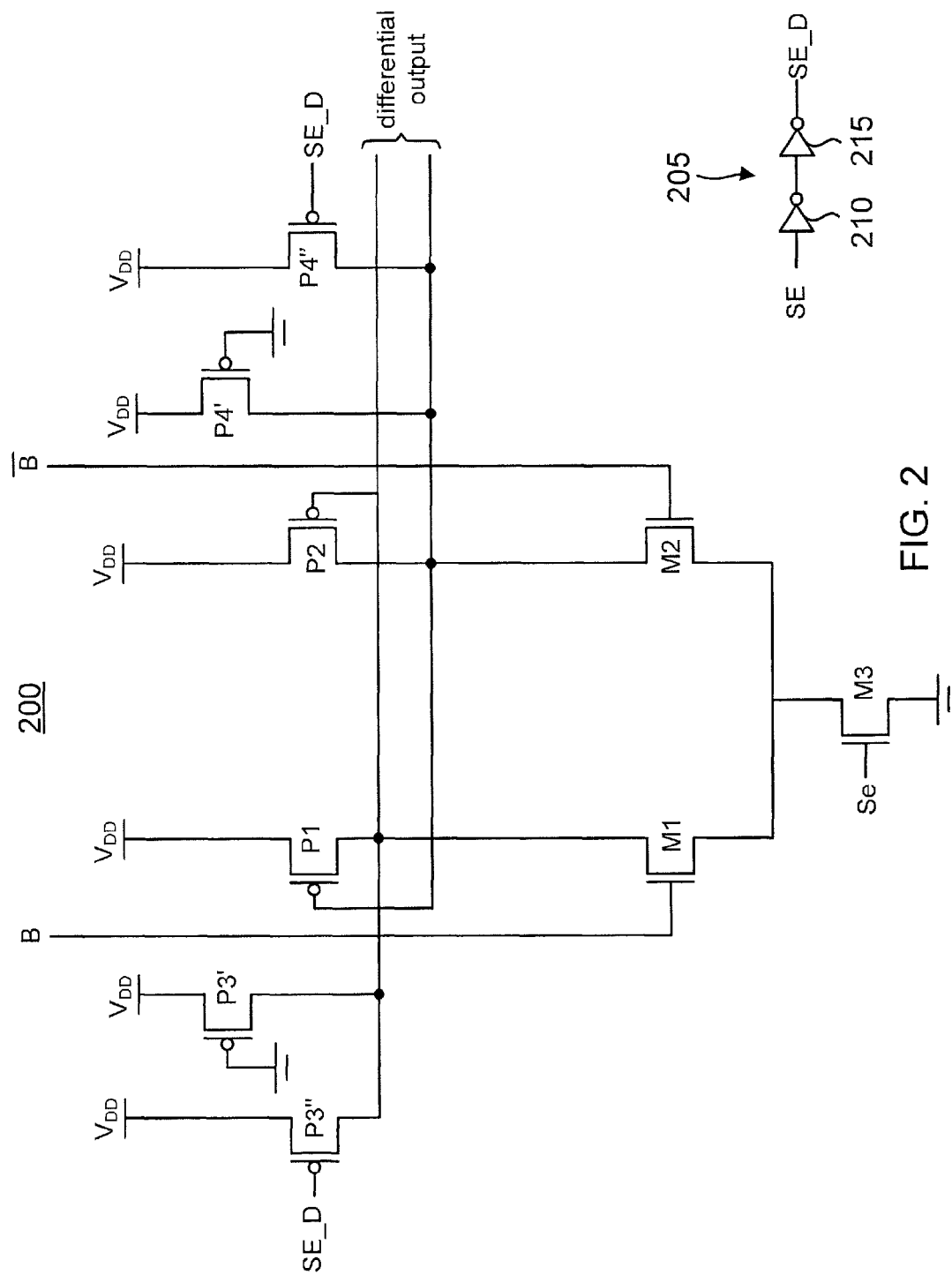
FIG. 2 is a circuit diagram of a sense amplifier in accordance with an embodiment of the disclosure.

A circuit diagram of an example sense amplifier 200 is shown in FIG. 2. An NMOS differential pair of transistors M1 and M2 as well as an NMOS current source transistor M3 are arranged as discussed with sense amplifier 100. The bit line B thus couples to the gate of differential pair transistor M1 whereas the complement bit line $\overline{B}$ couples to the gate of differential pair transistor M2. The sources for differential pair transistors M1 and M2 both couple to the drain of current source transistor M3, which in turn has its source coupled to ground. The sense enable signal SE drives the gate of current source transistor M3. In one embodiment, the differential pair of transistors M1 and M2 may be deemed to comprise a means for developing a differential output voltage between a pair of output terminals (such as, for example, their drain terminals) responsive to a differential voltage between a pair of bit lines.

In response to the assertion of the sense enable signal to a power supply voltage VDD, current source transistor M3 conducts a tail current that is steered through the differential pair transistors M1 and M2 responsive to the differential bit line voltage between the bit lines. For example, suppose the accessed SRAM cell (not illustrated) stores a binary value such that the voltage for bit line B is higher as compared to the voltage for complementary bit line $\overline{B}$. The majority of the tail current will then steer through differential pair transistor M1 such that its drain voltage (its output terminal voltage) decreases with respect to the drain voltage on differential pair transistor M2. To reinforce this voltage difference, sense amplifier 200 also includes the cross-coupled PMOS transistors P1 and P2 discussed with regard to conventional sense amplifier 100. The gate of cross-coupled transistor P1 couples to the drain of differential pair transistor M2. Similarly, the gate of cross-coupled transistor P2 couples to the drain of differential pair transistor M1. The source of cross-coupled transistor P1 couples to a power supply node supplying the power supply voltage VDD whereas its drain couples to the drain of differential pair transistor M1. Similarly, the source of cross-coupled transistor P2 couples to the power supply node whereas its drain couples to the drain of differential pair transistor M2.

Due to the cross-coupling of their gates, cross-coupled transistors P1 and P2 reinforce the differential output voltage developed between the differential pair drains. For example, should the differential bit line voltage be such that the drain voltage of differential pair transistor M1 is lower than the drain voltage of differential pair transistor M2, cross-coupled transistor P2 will tend to switch on to reinforce the already-high drain voltage for differential pair transistor M2. At the same time, the relatively high drain voltage for differential pair transistor M2 switches off cross-coupled transistor P1 so that it does not fight with the differential output voltage development. Similarly, cross-coupled transistor P1 would tend to switch on should the drain voltage for differential pair transistor M2 be lower than the drain voltage for differential pair transistor M1.

As will be explained further herein, the sense enable signal assertion may occur relatively quickly with regard to the word line voltage assertion. This is quite advantageous as such sense enable signal timing allows an increase in memory operating speed. But such a relatively small delay between the assertion of the word line voltage and the assertion of the sense enable signal voltage results in a differential bit line voltage development that will be relatively minor at the onset of the sense enable signal assertion. Since the bit lines are both pre-charged to the power supply voltage VDD prior to the assertion of the word line voltage, both differential pair transistors M1 and M2 will tend to turn on at the onset of the word line voltage assertion. As discussed with regard to conventional sense amplifier 100, such a simultaneous switching on of the differential pair transistors M1 and M2 increases the likelihood of a differential output voltage glitch. In that regard, note that due to inevitable imbalances, one of the differential pair transistors M1 and M2 will tend to switch on more strongly than the other such that an unpredictable differential voltage difference develops between their drains despite their gates being both charged substantially to the power supply voltage VDD. Such a differential voltage difference has no relationship to the binary value in the memory cell being accessed and is thus plainly undesirable. To suppress such an erroneous differential output voltage from developing at the onset of the sense enable signal assertion, the pull-up transistor P3 discussed with regard to conventional sense amplifier 100 is replaced by a first PMOS pull-up transistor P3' and a second PMOS pull-up transistor P3". Similarly, pull-up transistor P4 of conventional sense amplifier 100 is replaced by a first PMOS pull-up transistor P4' and a second PMOS pull-up transistor P4".

First pull-up transistor P3' has its source coupled to the power supply node and its drain coupled to the drain of differential pair transistor M1. Similarly, second pull-up transistor P3" has its source coupled to the power supply node and its drain coupled to the drain of differential pair transistor M1. However, the gate of second pull-up transistor P3" is grounded so that it functions as an always-on pull-up transistor whereas the gate of first pull-up transistor P3' is driven by a delayed version of the sense enable signal (SE_D). A delay circuit 205 is configured to delay the sense enable signal to produce the delayed sense enable signal. In a PMOS pull-up transistor embodiment such as sense amplifier 200, the rising edge of the sense enable signal (the onset of its assertion) is followed by the rising edge of the delayed version of the sense enable signal (the onset of its assertion). In this fashion, the first pull-up transistor P3' will switch off in response to the assertion of the delayed sense enable signal. To have such a rising edge relationship between the sense enable signal and the delayed sense enable signal, delay circuit 205 should have an even number of inverters such as shown for inverters 210 and 215. In an alternative NMOS pull-up transistor embodiment, the rising edge of the sense enable signal should be followed by a falling edge of the delayed sense enable signal such that delay circuit 205 would instead include an odd number of inverters. The following discussion will focus on a PMOS pull-up transistor embodiment without loss of generality.

First pull-up transistor P4' and second pull-up transistor P4" are analogous to pull-up transistors P3' and P3" in that first pull-up transistor P4' and second pull-up transistor P4" both have their sources coupled to the power supply node and their drains coupled to the drain of differential pair transistor M2. Similarly, the gate of first pull-up transistor P4' is driven by the delayed sense enable signal whereas the gate of second pull-up transistor P4" is grounded such that it is in an always-on configuration. Each transistor in the pair of first pull-up transistors P3' and P4' may be sized so as to be relatively strong. In contrast, each transistor in the pair of second pull-up transistors P3" and P4" may be sized (e.g., the dimensions of their widths) so as to be relatively weak in comparison to the first pull-up transistors P3' and P4'. The pair of conventional pull-up transistors P3 and P4 of sense amplifier 100 are thus effectively bifurcated into the pair of first pull-up transistors P3' and P4' as well as the pair of second pull-up transistors P3" and P4".

Delay circuit 205 may be configured with the appropriate number of delay elements such as inverters 210 and 215 so that the delayed sense enable signal is delayed by a fraction of the sense enable signal assertion period. In this fashion, during an initial portion of the sense enable signal assertion period (the period of time over which the sense enable signal is asserted for a given read operation), the pair of first pull-up transistors P3' and P4' are conducting so that they act to pull-up (charge) the drain voltages for the differential pair of transistors M1 and M2. It is during this initial portion of the sense enable signal assertion period that the bit line voltage difference is relatively undeveloped such that the gates for the differential pair of transistors M1 and M2 are effectively driven by a binary one (the power supply voltage VDD). But even though the differential pair transistors M1 and M2 will then both tend to turn on simultaneously at the onset of the sense enable signal assertion, sense amplifier 200 protects against differential output voltage glitches because of the relatively strong pull-up of the drain voltages for the differential pair of transistors M1 and M2 provided by the pair of first pull-up transistors P3' and P4'. Such a relatively strong pull-up from transistors P3 and P4 in conventional sense amplifier would force a relatively long delay between the word line assertion and the sense enable signal assertion, which slows memory operating speed. In contrast, the pair of first pull-up transistors P3' and P4' are switched off during the remaining portion of the sense enable assertion period so that no such relatively long delay is necessary. In this fashion, the operating speed for the memory serviced by sense amplifier 200 may be advantageously increased in comparison to conventional sense amplifier architectures.

Figure 3:
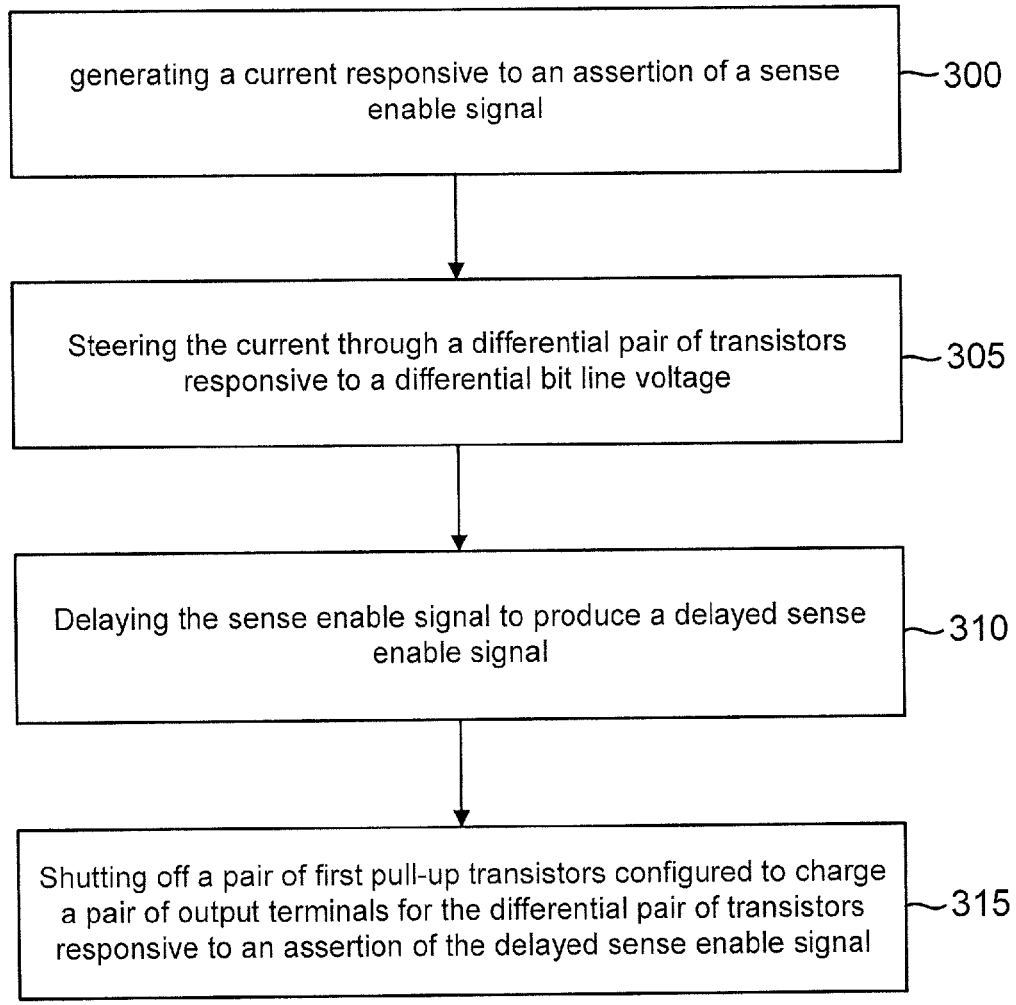
FIG. 3 is a flowchart of an example method of operation for a sense amplifier in accordance with an embodiment of the disclosure.

An example method of operation for a sense amplifier in accordance with an embodiment of the disclosure will now be addressed. FIG. 3 is a flowchart for an example method of operation for the disclosed sense amplifiers. The method comprises an act 300 of generating a current responsive to an assertion of a sense enable signal. The generation of the tail current by current source transistor M3 of sense amplifier 200 is an example of act 300. In addition, the method includes an act 305 of steering the current through a differential pair of transistors responsive to a differential bit line voltage. The steering of the tail current between differential pair transistors M1 and M2 of sense amplifier 200 responsive to the differential voltage between bit line B and complementary bit line B̄ is an example of act 305. The method also includes an act 310 of delaying the sense enable signal to produce a delayed sense enable signal. The production of the delayed sense enable signal by delay circuit 205 of sense amplifier 200 is an example of act 310. Finally, the method includes an act 315 of shutting off a pair of first pull-up transistors configured to charge a pair of output terminals for the differential pair of transistors responsive to an assertion of the delayed sense enable signal. The shutting off of the pair of first pull-up transistors P3' and P4' is an example of act 3154.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A sense amplifier comprising:
 a differential pair of transistors configured to steer a current responsive to a voltage difference between a pair of bit lines, wherein each differential pair transistor includes an output terminal;

a current source transistor configured to generate the current responsive to an assertion of a sense enable signal;

a delay circuit configured to delay the sense enable signal to provide a delayed sense enable signal; and a pair of first pull-up transistors corresponding to the differential pair of transistors, each first pull-up transistor being coupled between the output terminal of the corresponding differential pair transistor and a power supply node, wherein each first pull-up transistor is configured to switch off responsive to an assertion of the delayed sense enable signal.

2. The sense amplifier of claim 1, further comprising:

a pair of second pull-up transistors corresponding to the differential pair of transistors, each second pull-up transistor being coupled between the output terminal of the corresponding differential pair transistor and the power supply node, wherein each second pull-up transistor is configured to be always on.

3. The sense amplifier of claim 1, wherein the current source transistor couples between a second terminal for each differential pair transistor and ground.

4. The sense amplifier of claim 2, wherein the pair of first pull-up transistors comprises a pair of PMOS first pull-up transistors.

5. The sense amplifier of claim 2, wherein the pair of second pull-up transistors comprises a pair of PMOS second pull-up transistors, and wherein a gate for each PMOS second pull-up transistor is coupled to ground.

6. The sense amplifier of claim 2, wherein a size for each first pull-up transistor is greater than a size for each second pull-up transistor.

7. The sense amplifier of claim 1, wherein the delay circuit comprises a serial chain of inverters.

8. The sense amplifier of claim 7, wherein the serial chain of inverters comprises an even number of inverters.

9. The sense amplifier of claim 2, further comprising:

a pair of cross-coupled transistors corresponding to the differential pair of transistors, wherein each cross-coupled transistor is coupled between the power supply voltage node and the output terminal of the corresponding differential pair transistor.

10. The sense amplifier of claim 9, wherein a gate for each cross-coupled transistor is coupled to the output terminal for the differential pair transistor corresponding to a remaining one of the cross-coupled transistors.

11. The sense amplifier of claim 1, wherein the delay circuit is configured to delay the delayed sense enable signal by a delay equaling a fraction of a sense enable signal assertion period for the sense enable signal.

12. The sense amplifier of claim 1, wherein a gate of a first one of the differential pair transistors is coupled to a bit line and wherein a gate of a remaining second one of the differential pair transistors is coupled to a complementary bit line.

13. The sense amplifier of claim 12, wherein the bit line and the complementary bit line are both SRAM bit lines.

14. A method, comprising:

generating a current responsive to an assertion of a sense enable signal;

steering the current through a differential pair of transistors responsive to a differential bit line voltage;

delaying the sense enable signal to produce a delayed sense enable signal; and shutting off a pair of first pull-up transistors configured to charge a pair of output terminals for the differential pair of transistors responsive to an assertion of the delayed sense enable signal.

15. The method of claim 14, further comprising:

charging the pair of output terminals through a pair of always-on second pull-up transistors.

16. The method of claim 14, wherein delaying the sense enable signal comprises delaying the sense enable signal for a fraction of a sense enable assertion period over which the sense enable signal is asserted.

17. A sense amplifier, comprising:

means for developing a differential output voltage between a pair of output terminals responsive to a differential voltage between a pair of bit lines and responsive to an assertion of a sense enable signal;

a delay circuit configured to delay the sense enable signal to provide a delayed sense enable signal; and a pair of first pull-up transistors corresponding to the pair of output terminals, each first pull-up transistor being coupled between the corresponding output terminal and a power supply node, wherein each first pull-up transistor is configured to switch off responsive to an assertion of the delayed sense enable signal.

18. The sense amplifier of claim 17, further comprising:

a pair of second pull-up transistors corresponding to the pair of output terminals, each second pull-up transistor being coupled between the corresponding output terminal and a power supply node, wherein each second pull-up transistor is configured to be always on.

19. The sense amplifier of claim 17, wherein the delay circuit comprises a serial chain of inverters.

* * * * *